United States Patent
Cernea

(10) Patent No.: US 11,842,777 B2
(45) Date of Patent: Dec. 12, 2023

(54) METHODS FOR REDUCING DISTURB ERRORS BY REFRESHING DATA ALONGSIDE PROGRAMMING OR ERASE OPERATIONS

(71) Applicant: SUNRISE MEMORY CORPORATION, San Jose, CA (US)

(72) Inventor: Raul Adrian Cernea, Santa Clara, CA (US)

(73) Assignee: SUNRISE MEMORY CORPORATION, San Jose, CA (US)

( * ) Notice: Subject to any disclaimer, the term of this patent is extended or adjusted under 35 U.S.C. 154(b) by 0 days.

(21) Appl. No.: 17/525,712

(22) Filed: Nov. 12, 2021

(65) Prior Publication Data

US 2022/0157391 A1    May 19, 2022

Related U.S. Application Data

(60) Provisional application No. 63/114,958, filed on Nov. 17, 2020.

(51) Int. Cl.
*G11C 16/34* (2006.01)
*G11C 16/26* (2006.01)
*G11C 16/14* (2006.01)
*G11C 16/04* (2006.01)

(52) U.S. Cl.
CPC ...... *G11C 16/3427* (2013.01); *G11C 16/0466* (2013.01); *G11C 16/14* (2013.01); *G11C 16/26* (2013.01)

(58) Field of Classification Search
CPC .................................................. G11C 15/3427
See application file for complete search history.

(56) References Cited

U.S. PATENT DOCUMENTS

| | | | |
|---|---|---|---|
| 4,213,139 | A | 7/1980 | Rao |
| 4,984,153 | A | 1/1991 | Kregness et al. |
| 5,388,246 | A | 2/1995 | Kasai |
| 5,583,808 | A | 12/1996 | Brahmbhatt |
| 5,646,886 | A | 7/1997 | Brahmbhatt |
| 5,656,842 | A | 8/1997 | Iwamatsu |
| 5,768,192 | A | 6/1998 | Eitan |
| 5,789,776 | A | 8/1998 | Lancaster et al. |

(Continued)

FOREIGN PATENT DOCUMENTS

| | | |
|---|---|---|
| CN | 111799263 A | 10/2020 |
| JP | 1998-269789 A2 | 10/1998 |

(Continued)

OTHER PUBLICATIONS

"EP Extended Search Report EP168690149.3", dated Oct. 18, 2019.

(Continued)

*Primary Examiner* — Joshua L Schwartz
(74) *Attorney, Agent, or Firm* — Edward C. Kwok

(57) ABSTRACT

A method is for ensuring data integrity in memory pages includes: dividing the memory pages into a predetermined number of refresh groups; and for each write operation to be performed on a selected memory page: (a) selecting one of the refresh groups; (b) reading data from the memory pages of the selected refresh group; and (d) concurrently (i) performing the write operation on the selected memory page, and (ii) writing back the data read into the memory pages of the selected refresh group.

22 Claims, 10 Drawing Sheets

(56) References Cited

U.S. PATENT DOCUMENTS

| | | | |
|---|---|---|---|
| 5,880,993 | A | 3/1999 | Kramer et al. |
| 5,915,167 | A | 6/1999 | Leedy |
| 6,040,605 | A | 3/2000 | Sano et al. |
| 6,049,497 | A * | 4/2000 | Yero .................. G11C 11/5621 365/185.11 |
| 6,057,862 | A | 5/2000 | Margulis |
| 6,107,133 | A | 8/2000 | Furukawa et al. |
| 6,118,171 | A | 9/2000 | Davies et al. |
| 6,130,838 | A | 10/2000 | Kim et al. |
| 6,313,518 | B1 | 11/2001 | Ahn et al. |
| 6,314,046 | B1 | 11/2001 | Kamiya et al. |
| 6,362,508 | B1 | 3/2002 | Rasovaky et al. |
| 6,396,744 | B1 * | 5/2002 | Wong ...................... G11C 11/56 365/185.25 |
| 6,434,053 | B1 | 8/2002 | Fujiwara |
| 6,580,124 | B1 | 6/2003 | Cleeves et al. |
| 6,587,365 | B1 | 7/2003 | Salling |
| 6,744,094 | B2 | 6/2004 | Forbes |
| 6,754,105 | B1 | 6/2004 | Chang et al. |
| 6,774,458 | B2 | 8/2004 | Fricke et al. |
| 6,873,004 | B1 | 3/2005 | Han et al. |
| 6,881,994 | B2 | 4/2005 | Lee et al. |
| 6,946,703 | B2 | 9/2005 | Ryu et al. |
| 7,005,350 | B2 | 2/2006 | Walker et al. |
| 7,177,977 | B2 * | 2/2007 | Chen .................. G11C 16/3427 711/163 |
| 7,223,653 | B2 | 5/2007 | Cheng et al. |
| 7,307,308 | B2 | 12/2007 | Lee |
| 7,426,141 | B2 | 9/2008 | Takeuchi |
| 7,489,002 | B2 | 2/2009 | Forbes et al. |
| 7,495,963 | B2 | 2/2009 | Edahiro et al. |
| 7,512,012 | B2 | 3/2009 | Kuo |
| 7,524,725 | B2 | 4/2009 | Chung |
| 7,542,348 | B1 | 6/2009 | Kim |
| 7,612,411 | B2 | 11/2009 | Walker |
| 7,804,145 | B2 | 9/2010 | Shimizu et al. |
| 7,876,614 | B2 | 1/2011 | Kang et al. |
| 7,940,563 | B2 | 5/2011 | Yokoi |
| 8,026,521 | B1 | 9/2011 | Or-Bach et al. |
| 8,139,418 | B2 | 3/2012 | Carman |
| 8,178,396 | B2 | 5/2012 | Sinha et al. |
| 8,237,213 | B2 | 8/2012 | Liu |
| 8,278,183 | B2 | 10/2012 | Lerner |
| 8,383,482 | B2 | 2/2013 | Kim et al. |
| 8,395,942 | B2 | 3/2013 | Samachisa et al. |
| 8,604,618 | B2 | 12/2013 | Cooney et al. |
| 8,630,114 | B2 | 1/2014 | Lue |
| 8,743,612 | B2 | 6/2014 | Choi et al. |
| 8,767,473 | B2 | 7/2014 | Shim et al. |
| 8,848,425 | B2 | 9/2014 | Schloss |
| 8,878,278 | B2 | 11/2014 | Alsmeier et al. |
| 9,158,622 | B2 | 10/2015 | Lee et al. |
| 9,190,293 | B2 | 11/2015 | Wang et al. |
| 9,202,694 | B2 | 12/2015 | Konevecki et al. |
| 9,230,985 | B1 | 1/2016 | Wu et al. |
| 9,299,580 | B2 | 3/2016 | Kong et al. |
| 9,391,084 | B2 | 7/2016 | Lue |
| 9,412,752 | B1 | 8/2016 | Yeh et al. |
| 9,455,268 | B2 | 9/2016 | Oh et al. |
| 9,620,605 | B2 | 4/2017 | Liang et al. |
| 9,633,944 | B2 | 4/2017 | Kim |
| 9,698,152 | B2 | 7/2017 | Peri |
| 9,711,529 | B2 | 7/2017 | Hu et al. |
| 9,748,172 | B2 | 8/2017 | Takaki |
| 9,799,761 | B2 | 10/2017 | Or-Bach et al. |
| 9,842,651 | B2 | 12/2017 | Harari |
| 9,892,800 | B2 | 2/2018 | Harari |
| 9,911,497 | B1 | 3/2018 | Harari |
| 10,014,317 | B2 | 7/2018 | Peng |
| 10,074,667 | B1 | 9/2018 | Higashi |
| 10,096,364 | B2 | 10/2018 | Harari |
| 10,121,553 | B2 | 11/2018 | Harari |
| 10,157,780 | B2 | 12/2018 | Wu et al. |
| 10,217,667 | B2 | 2/2019 | Or-Bach et al. |
| 10,249,370 | B2 | 4/2019 | Harari |
| 10,254,968 | B1 | 4/2019 | Gazit et al. |
| 10,283,493 | B1 | 5/2019 | Nishida |
| 10,319,696 | B1 | 6/2019 | Nakano |
| 10,373,956 | B2 | 8/2019 | Gupta et al. |
| 10,381,370 | B2 | 8/2019 | Shin et al. |
| 10,381,378 | B1 | 8/2019 | Harari |
| 10,395,737 | B2 | 8/2019 | Harari |
| 10,431,596 | B2 | 10/2019 | Hierner et al. |
| 10,475,812 | B2 | 11/2019 | Harari |
| 10,608,008 | B2 | 3/2020 | Harari et al. |
| 10,608,011 | B2 | 3/2020 | Harari et al. |
| 10,622,377 | B2 | 4/2020 | Harari et al. |
| 10,651,153 | B2 | 5/2020 | Fastow et al. |
| 10,651,196 | B1 | 5/2020 | Sharangpani et al. |
| 10,692,837 | B1 | 6/2020 | Nguyen et al. |
| 10,692,874 | B2 | 6/2020 | Harari et al. |
| 10,950,616 | B2 | 3/2021 | Harari et al. |
| 11,043,280 | B1 * | 6/2021 | Prakash .............. G11C 11/5671 |
| 2001/0030340 | A1 | 10/2001 | Fujiwara |
| 2001/0053092 | A1 | 12/2001 | Kosaka et al. |
| 2002/0012271 | A1 | 1/2002 | Forbes |
| 2002/0028541 | A1 | 3/2002 | Lee et al. |
| 2002/0051378 | A1 | 5/2002 | Ohsawa |
| 2002/0193484 | A1 | 12/2002 | Albee |
| 2003/0038318 | A1 | 2/2003 | Forbes |
| 2004/0214387 | A1 | 10/2004 | Madurawe et al. |
| 2004/0246807 | A1 | 12/2004 | Lee |
| 2004/0262681 | A1 | 12/2004 | Masuoka et al. |
| 2004/0262772 | A1 | 12/2004 | Ramanathan et al. |
| 2004/0264247 | A1 | 12/2004 | Kim |
| 2005/0128815 | A1 | 6/2005 | Ishikawa et al. |
| 2005/0236625 | A1 | 10/2005 | Schuele et al. |
| 2005/0280061 | A1 | 12/2005 | Lee |
| 2006/0001083 | A1 | 1/2006 | Bhattacharyya |
| 2006/0080457 | A1 | 4/2006 | Hiramatsu et al. |
| 2006/0155921 | A1 | 7/2006 | Gorobets et al. |
| 2006/0212651 | A1 | 9/2006 | Ashmore |
| 2006/0261404 | A1 | 11/2006 | Forbes |
| 2007/0012987 | A1 | 1/2007 | McTeer |
| 2007/0023817 | A1 | 2/2007 | Dao |
| 2007/0045711 | A1 | 3/2007 | Bhattacharyya |
| 2007/0134876 | A1 | 6/2007 | Lai et al. |
| 2007/0192518 | A1 | 8/2007 | Rupanagunta et al. |
| 2008/0022026 | A1 | 1/2008 | Yang et al. |
| 2008/0054346 | A1 | 3/2008 | Saitoh et al. |
| 2008/0160765 | A1 | 7/2008 | Lee et al. |
| 2008/0173930 | A1 | 7/2008 | Watanabe |
| 2008/0178794 | A1 | 7/2008 | Cho et al. |
| 2008/0212358 | A1 | 9/2008 | Mitsui |
| 2008/0239812 | A1 | 10/2008 | Naofumi et al. |
| 2008/0266960 | A1 | 10/2008 | Kuo |
| 2008/0291723 | A1 | 11/2008 | Wang et al. |
| 2008/0301359 | A1 | 12/2008 | Smith |
| 2009/0057722 | A1 | 3/2009 | Masuoka et al. |
| 2009/0140318 | A1 | 6/2009 | Dong |
| 2009/0157946 | A1 | 6/2009 | Arya |
| 2009/0237996 | A1 | 9/2009 | Kirsch et al. |
| 2009/0268519 | A1 | 10/2009 | Ishii |
| 2009/0279360 | A1 | 11/2009 | Peter et al. |
| 2009/0290442 | A1 | 11/2009 | Rajan |
| 2009/0316487 | A1 | 12/2009 | Lee et al. |
| 2010/0013001 | A1 | 1/2010 | Cho et al. |
| 2010/0121994 | A1 | 5/2010 | Kim et al. |
| 2010/0124116 | A1 | 5/2010 | Takashi et al. |
| 2010/0128509 | A1 | 5/2010 | Kim et al. |
| 2010/0207185 | A1 | 8/2010 | Lee et al. |
| 2010/0219392 | A1 | 9/2010 | Awaya et al. |
| 2010/0254191 | A1 | 10/2010 | Son et al. |
| 2010/0327413 | A1 | 12/2010 | Lee et al. |
| 2011/0044113 | A1 | 2/2011 | Kim |
| 2011/0047325 | A1 | 2/2011 | Mishima |
| 2011/0115011 | A1 | 5/2011 | Masuoka et al. |
| 2011/0134705 | A1 | 6/2011 | Jones et al. |
| 2011/0143519 | A1 | 6/2011 | Lerner |
| 2011/0170266 | A1 | 7/2011 | Haensh et al. |
| 2011/0208905 | A1 | 8/2011 | Shaeffer et al. |
| 2011/0298013 | A1 | 12/2011 | Hwang et al. |
| 2011/0310683 | A1 | 12/2011 | Gorobets |
| 2012/0063223 | A1 | 3/2012 | Lee |

(56) References Cited

U.S. PATENT DOCUMENTS

| | | |
|---|---|---|
| 2012/0146126 A1 | 6/2012 | Lai et al. |
| 2012/0182801 A1 | 7/2012 | Lue |
| 2012/0208347 A1 | 8/2012 | Hwang et al. |
| 2012/0223380 A1 | 9/2012 | Lee et al. |
| 2012/0243314 A1 | 9/2012 | Takashi |
| 2012/0307568 A1 | 12/2012 | Banna et al. |
| 2012/0327714 A1 | 12/2012 | Lue |
| 2013/0031325 A1 | 1/2013 | Nakamoto et al. |
| 2013/0256780 A1 | 10/2013 | Kai et al. |
| 2014/0015036 A1 | 1/2014 | Fursin et al. |
| 2014/0040698 A1 | 2/2014 | Loh et al. |
| 2014/0070289 A1 | 3/2014 | Tanaka et al. |
| 2014/0075135 A1 | 3/2014 | Choi et al. |
| 2014/0117366 A1 | 5/2014 | Saitoh |
| 2014/0151774 A1 | 6/2014 | Rhie |
| 2014/0173017 A1 | 6/2014 | Takagi et al. |
| 2014/0213032 A1 | 7/2014 | Kai et al. |
| 2014/0229131 A1 | 8/2014 | Cohen et al. |
| 2014/0247674 A1 | 9/2014 | Karda et al. |
| 2014/0328128 A1 | 11/2014 | Louie et al. |
| 2014/0340952 A1 | 11/2014 | Ramaswamy et al. |
| 2015/0054507 A1 | 2/2015 | Gulaka et al. |
| 2015/0098272 A1 | 4/2015 | Kasolra et al. |
| 2015/0113214 A1 | 4/2015 | Sutardja |
| 2015/0155876 A1 | 6/2015 | Jayasena et al. |
| 2015/0194440 A1 | 7/2015 | Noh et al. |
| 2015/0220463 A1 | 8/2015 | Fluman et al. |
| 2015/0249143 A1 | 9/2015 | Sano |
| 2015/0263005 A1 | 9/2015 | Zhao et al. |
| 2015/0340371 A1 | 11/2015 | Lui |
| 2015/0372099 A1 | 12/2015 | Chen et al. |
| 2016/0013156 A1 | 1/2016 | Zhai et al. |
| 2016/0019951 A1 | 1/2016 | Park et al. |
| 2016/0035711 A1 | 2/2016 | Hu |
| 2016/0086970 A1 | 3/2016 | Peng |
| 2016/0141294 A1 | 5/2016 | Peri et al. |
| 2016/0225860 A1 | 8/2016 | Karda et al. |
| 2016/0276360 A1 | 9/2016 | Doda et al. |
| 2016/0300724 A1 | 10/2016 | Levy et al. |
| 2016/0314042 A1 | 10/2016 | Plants |
| 2016/0321002 A1 | 11/2016 | Jung et al. |
| 2016/0358934 A1 | 12/2016 | Lin et al. |
| 2017/0053906 A1 | 2/2017 | Or-Bach et al. |
| 2017/0092370 A1 | 3/2017 | Harari |
| 2017/0092371 A1 | 3/2017 | Harari |
| 2017/0148517 A1 | 5/2017 | Harari |
| 2017/0148810 A1 | 5/2017 | Kai et al. |
| 2017/0194341 A1 | 7/2017 | Yamada |
| 2017/0213731 A1 | 7/2017 | Yoon et al. |
| 2017/0213821 A1 | 7/2017 | Or-Bach et al. |
| 2017/0358594 A1 | 12/2017 | Lu et al. |
| 2018/0095127 A1 | 4/2018 | Pappu et al. |
| 2018/0108416 A1 | 4/2018 | Harari |
| 2018/0151419 A1 | 5/2018 | Wu et al. |
| 2018/0261613 A1 | 9/2018 | Ariyoshi et al. |
| 2018/0269229 A1 | 9/2018 | Or-Bach et al. |
| 2018/0286918 A1 | 10/2018 | Bandyopadhyay et al. |
| 2018/0314635 A1* | 11/2018 | Alam ............... G11C 29/52 |
| 2018/0330791 A1 | 11/2018 | Li et al. |
| 2018/0331042 A1 | 11/2018 | Manusharow et al. |
| 2018/0342455 A1 | 11/2018 | Nosho et al. |
| 2018/0342544 A1 | 11/2018 | Lee et al. |
| 2018/0366471 A1 | 12/2018 | Harari et al. |
| 2018/0366485 A1 | 12/2018 | Harari |
| 2018/0366489 A1 | 12/2018 | Harari et al. |
| 2019/0006009 A1 | 1/2019 | Harari |
| 2019/0006015 A1 | 1/2019 | Norman et al. |
| 2019/0019564 A1 | 1/2019 | Li et al. |
| 2019/0067327 A1 | 2/2019 | Herner et al. |
| 2019/0148286 A1 | 5/2019 | Or-Bach et al. |
| 2019/0157296 A1 | 5/2019 | Harari et al. |
| 2019/0180821 A1 | 6/2019 | Harari |
| 2019/0206890 A1 | 7/2019 | Harari et al. |
| 2019/0214077 A1 | 7/2019 | Oh et al. |
| 2019/0238134 A1 | 8/2019 | Lee et al. |
| 2019/0244971 A1 | 8/2019 | Harari |
| 2019/0259769 A1 | 8/2019 | Karda et al. |
| 2019/0303042 A1 | 10/2019 | Kim et al. |
| 2019/0304988 A1 | 10/2019 | Dong et al. |
| 2019/0325945 A1 | 10/2019 | Linus |
| 2019/0325964 A1 | 10/2019 | Harari |
| 2019/0319044 A1 | 11/2019 | Harari |
| 2019/0348424 A1 | 11/2019 | Karda et al. |
| 2019/0355747 A1 | 11/2019 | Hierner et al. |
| 2019/0370117 A1 | 12/2019 | Fruchtman et al. |
| 2020/0020718 A1 | 1/2020 | Harari et al. |
| 2020/0051990 A1 | 2/2020 | Harari et al. |
| 2020/0063263 A1 | 2/2020 | Yang et al. |
| 2020/0098738 A1 | 3/2020 | Herner et al. |
| 2020/0098779 A1 | 3/2020 | Cernea et al. |
| 2020/0098881 A1 | 3/2020 | Vellianitis |
| 2020/0176468 A1 | 6/2020 | Herner et al. |
| 2020/0201718 A1 | 6/2020 | Richter et al. |
| 2020/0203378 A1 | 6/2020 | Harari et al. |
| 2020/0219572 A1 | 7/2020 | Harari |
| 2020/0243486 A1 | 7/2020 | Quader et al. |
| 2020/0258897 A1 | 8/2020 | Yan et al. |
| 2020/0350234 A1 | 11/2020 | Shan et al. |
| 2020/0357822 A1 | 11/2020 | Chen |
| 2020/0403002 A1 | 12/2020 | Harari |
| 2021/0013224 A1 | 1/2021 | Purayath et al. |
| 2021/0175251 A1 | 6/2021 | Zhang et al. |
| 2021/0247910 A1 | 8/2021 | Kim et al. |
| 2021/0248094 A1 | 8/2021 | Norman et al. |
| 2021/0265308 A1 | 8/2021 | Norman et al. |
| 2021/0375933 A1 | 12/2021 | Lu et al. |
| 2021/0407600 A1* | 12/2021 | Cariello ............... G11C 16/26 |
| 2022/0028876 A1 | 1/2022 | Purayath et al. |
| 2022/0028886 A1 | 1/2022 | Pur et al. |
| 2022/0084564 A1* | 3/2022 | Choi ............... G11C 11/406 |
| 2022/0139933 A1 | 5/2022 | Noack |
| 2022/0231049 A1 | 7/2022 | Lin et al. |
| 2022/0246766 A1 | 8/2022 | Manfrini et al. |
| 2022/0254390 A1 | 8/2022 | Gans et al. |
| 2022/0351776 A1 | 11/2022 | Nam et al. |
| 2022/0384459 A1 | 12/2022 | Lu et al. |
| 2022/0393031 A1 | 12/2022 | Ando et al. |
| 2023/0052477 A1 | 2/2023 | Ha et al. |

FOREIGN PATENT DOCUMENTS

| | | |
|---|---|---|
| JP | 2006099827 A1 | 4/2006 |
| JP | 2010108522 A1 | 5/2010 |
| JP | 2010251572 A | 11/2010 |
| JP | 2011028540 A1 | 2/2011 |
| KR | 20120085591 A1 | 8/2012 |
| KR | 20120085603 A | 8/2012 |
| WO | 2015025357 A1 | 2/2015 |
| WO | 2018236937 A1 | 12/2018 |

OTHER PUBLICATIONS

"European Search Report, EP 16852238.1", dated Mar. 28, 2019.
"European Search Report, EP17844550.8", dated Aug. 12, 2020, 11 pages.
"Invitation to Pay Additional Fees (PCT/ISA/206), PCT/US2020/015710", Mar. 20, 2020, 2 pages.
"Notification of Reasons for Refusal, Japanese Patent Application 2018-527740", dated Nov. 4, 2020, 8 pages.
"Partial European Search Report EP 16869049.3", dated Jul. 1, 2019, pp. 1-12.
"PCT Search Report and Written Opinion, PCT/US2018/038373", dated Sep. 10, 2018.
"PCT Search Report and Written Opinion, PCT/US2019/014319", dated Apr. 15, 2019.
"PCT Search Report and Written Opinion, PCT/US2019/052164", dated Feb. 27, 2020.
"PCT Search Report and Written Opinion, PCT/US2019/052446", dated Dec. 11, 2019.
"PCT Search Report and Written Opinion, PCT/US2020/015710", dated Jun. 9, 2020.

(56) References Cited

OTHER PUBLICATIONS

"PCT Search Report and Written Opinion, PCT/US2020/017494", dated Jul. 20, 2020, 13 pages.
"PCT Search Report and Written Opinion, PCT/US2020/065374", dated Mar. 15, 2021, 17 pages.
"PCT Search Report and Written Opinion, PCT/US2020/065670", dated Apr. 5, 2021, 12 pages.
"PCT Search Report and Written Opinion, PCT/US2021/016964", dated Jun. 15, 2021, 19 pages.
"PCT Search Report and Written Opinion, PCT/US2021/025722", dated Jun. 15, 2021, 10 pages.
Hou, S. Y., et al., "Wafer-Leval Integration of an Advanced Logic-Memory System Through the Second-Generation CoWoS Technology", IEEE Transactions on Electron Devices, vol. 64, No. 10, Oct. 2017, 4071-4077.
Kim, N., et al., "Multi-layered Vertical gate NANO Flash Overcoming Stacking Limit for Terabit Density Storage", Symposium on VLSI Tech. Dig. of Technical Papers, 2009, pp. 188-189.
Lue, H.T., et al., "A Highly Scalable 8- Layer 3D Vertical-gate {VG} TFT NANO Flash Using Junction-Free Buried Channel BE-SONOS Device", Symposium on VLSI: Tech. Dig. Of Technical Papers, 2010, pp. 131-132.
Tanaka, T., et al., "A 768 GB 3b/cell 3D-Floaling-Gate NANO Flash Memory", Digest of Technical Papers, the 2016 IEEE International Solid-Slate Circuits Conference, 2016, pp. 142-144.
Wann, H.C., et al., "High-Endurance Ultra-Thin Tunnel Oxide in Monos Device Structure for Dynamic Memory Application", IEEE Electron Device letters, vol. 16, No. 11, Nov. 1995, pp. 491-493.
Wu, Jixuan, et al., "A Monolithic 3D Integration of RRAM Array with Oxide Semiconductor FET for In-Memory Computing in Quantized Neural Network AI Applications", 2020 IEEE Symposium on VLSI Technology Digest of Technical Papers, Honolulu, Hi, USA, Jun. 2020, 4 pages.
"Invitation to Pay Additional Fees, PCT/US2019/065256", Feb. 13, 2020, 2 pages.
"PCT Search Report and Written Opinion, PCT/US2018/067338", dated May 8, 2019.
"PCT Search Report and Written Opinion, PCT/US2019/041678", dated Oct. 9, 2019.
"PCT Search Report and Written Opinion, PCT/US2019/065256", dated Apr. 14, 2020.
"PCT Search Report and Written Opinion, PCT/US2021/042607", dated Nov. 4, 2021, 17 pages.
"PCT Search Report and Written Opinion, PCT/US2021/064844", dated Mar. 8, 2022, 15 paged.
"PCT Search Report and Written Opinion, PCT/US2021/42620", dated Oct. 28, 2021, 18 pages.
Park, Goon-Ho, et al., "Electrical Characteristics of SiO2/High-k Dielectric Stacked Tunnel Barriers for Nonvolatile Memory Applications", Journal of the Korean Physical Society, vol. 55, No. 1, Jul. 2009, pp. 116-119.
Tan, Yan-Ny, et al., "Over-Erase Phenomenon in Songs-Type Flash Memory and its Minimization Using a Hafnium Oxide Charge Storage Layer", IEEE Transactions on Electron Devices, vol. 51, No. 7, Jul. 2004, pp. 1143-1147.

\* cited by examiner

METHODS FOR REDUCING DISTURB ERRORS BY REFRESHING DATA ALONGSIDE PROGRAMMING OR ERASE OPERATIONS

CROSS-REFERENCE TO RELATED APPLICATIONS

The present application relates to U.S. provisional patent application ("Provisional Application"), Ser. No. 63/114,958, entitled "Methods for Reducing Disturb Errors By Data Refresh During Write Operations," filed on Nov. 17, 2020. The Provisional Patent Application is hereby incorporated by reference in its entirety.

BACKGROUND OF THE INVENTION

1. Field of the Invention

The present invention relates to data integrity in high-density memory circuits. In particular, the present invention preserves data integrity by reducing the impact of programming or erase disturbs in non-selected storage transistors in the vicinity of a storage transistor that is being written or erased.

2. Discussion of the Related Art

U.S. Pat. No. 10,121,553 ("the '533 patent"), entitled "Capacitive-Coupled Non-Volatile Thin-film Transistor NOR Strings in Three-Dimensional Arrays," filed on Aug. 26, 2016 and issued on Nov. 6, 2018, discloses storage or memory transistors organized as 3-dimensional arrays of NOR strings formed above a planar surface of a semiconductor substrate. In the '533 patent, a NOR memory string includes numerous thin-film storage transistors that share a common bit line and a common source line. In one implementation, storage transistors in a NOR memory string are arranged along a direction ("horizontal direction") that is substantially parallel to the planar surface of the semiconductor substrate. In such a 3-dimensional array, the NOR memory strings are provided on multiple planes (e.g., 8 or 16 planes) above the semiconductor substrate, with the NOR memory strings on each plane arranged in rows and columns along two orthogonal horizontal directions. The NOR memory string may each extend along one of the horizontal directions. Data is stored in a charge-trapping layer (e.g., a silicon oxide-silicon nitride-silicon oxide triple layer) in each storage transistor. The disclosure of the '533 patent is hereby incorporated by reference in its entirety for all purposes.

In the '533 patent, each storage transistor of a NOR memory string is read, programmed or erased by suitably biasing its associated word line and the common bit line it shares with other storage transistors in the NOR memory string. In some examples, the '533 patent discloses that the storage transistors may share a common source line that is pre-charged prior to a read, programming or erase operation to a predetermined voltage and maintains substantially that predetermined voltage during the operation by a capacitor ("virtual ground"), such as the parasitic capacitor formed by a number of connected common source lines in multiple NOR memory strings. In other examples, the common source line may be biased by a constant voltage source of a suitable voltage. The storage transistor's associated word line is shared with storage transistors of NOR memory strings on other planes. In those configurations, the storage transistors are aligned along the direction normal to the planar surface of the semiconductor substrate ("vertical direction"). Each word line may also be shared between two storage transistors from adjacent NOR memory strings. To program or erase a storage transistor, for example, a substantial voltage difference (e.g., 8.0 volts) is imposed across the common bit line and the word line. However, as the word line of a selected transistor is shared with non-selected storage transistors on other NOR memory strings and as the common bit line of the selected transistor is shared with other non-selected transistors on its NOR memory string, the non-selected transistors must be protected from inadvertently being set into the programmed or the erased state during a programming or erase operation, as they are vulnerable to interference or "disturb" arising from the bias voltages (e.g., by capacitive coupling). To mitigate disturbs to a storage transistor, a predetermined voltage difference that is significantly less in magnitude than the required voltage difference to program or to erase may be imposed across a storage transistor's associated word line and its common bit line, so as to inhibit undesired programming or erasing of the storage transistor.

In this detailed description, the term "write operation" (or simply "write") may refer to either a programming operation or an erase operation that sets a storage transistor to a known data storage state (e.g., "programmed state" or "erased state").

SUMMARY

According to one embodiment of the present invention, a method is provided for ensuring data integrity in memory pages implemented in a 3-dimensional array of storage transistors. The method includes: dividing the memory pages into a predetermined number of refresh groups; and for each write operation to be performed on a selected one of the memory pages: (a) selecting one of the refresh groups; (b) reading data from one or more memory page in the selected refresh group; and (c) concurrently, (i) performing the write operation on the selected memory page, and (ii) writing back the read data into the memory pages of the selected refresh group. Each write operation may include an erase phase and a program phase, in which: (a) during the erase phase, the write operation carries out an erase operation on each storage transistor in the selected page that is designated for the erased state, and (b) during the program phase, the write operation carries out a program operation on each storage transistor in the selected page that is designated for to be in the programmed state.

According to one embodiment of the present invention, the method selects the refresh group according to a predetermined schedule, so as to limit the number of program or erase disturbs experienced between selections by the memory pages within each refresh group. The state of the schedule (i.e., where in the schedule is the current write operation) may be stored with the data. To ensure integrity, the state may be stored in multiple copies (e.g., stored in each of the memory pages) to allow redundancy. Alternatively, the schedule may be stored in odd number of copies (e.g., 3) in designated pages, so that a corrupted state may be recovered by a consensus majority. With redundancy, the method proceeds after recovering the state from a first attempt using states retrieved from both the selected page and at least one of the memory pages from the refresh group. In one embodiment, when the state cannot be recovered from the first attempt, states may be retrieved from one or more additional memory pages from the refresh group. The state may be determined according to majority consensus. To avoid reading multiple memory pages from the refresh group, in yet another alternative, multiple copies (e.g., preferably 3 or any suitable odd number) may be stored in a designated page. In that embodiment, a majority consensus (3:0 or 2:1) controls. In one embodiment, the state of the schedule is represented in the memory pages as Grey codes.

According to one embodiment of the present invention, the method for ensuring data integrity is applied to a 3-dimensional array of storage transistors organized as a 3-dimensional array of NOR memory strings. Within a NOR memory string, the storage transistors are each associated with a different word line. In one embodiment, the number of refresh groups is determined from a figure of merit that represents the number of times an inhibit voltage pulse is applied across a non-selected common bit line and a selected word line. (The inhibit voltage is a predetermined voltage that prevents a non-selected transistor on the same word line from being undesirably written into.) The method that concurrently performs the write operation and write backs the data read from memory pages in the refresh group includes: (a) selecting one of word lines and one of the common bit lines; (b) biasing the selected word line and the selected common bit line to a predetermined voltage difference for a programming or erase operation; (c) biasing each of the non-selected common bit lines to a first voltage, such that a first voltage difference exists between the selected common bit line and each of the non-selected common bit line, the first voltage difference being a first fraction—i.e., less than 1.0 in magnitude—of the predetermined voltage difference; and (d) biasing each of the non-selected word lines to a second voltage, such that a second voltage difference exists between the selected common bit line and each of the non-selected common bit line, the second voltage difference being a second fraction—i.e., less than 1.0 in magnitude—of the predetermined voltage difference.

According to one embodiment of the present invention, the method for ensuring data integrity is applied to memory pages organized as "slices", with each slice including a storage transistor from each memory page and with the storage transistors in the slice being associated with the same word line. In one embodiment, the storage transistors in a slice share a single sense amplifier.

The present invention is better understood upon consideration of the detailed description below in conjunction with the drawings.

DETAILED DESCRIPTION OF THE
PREFERRED EMBODIMENTS

Figure 1:
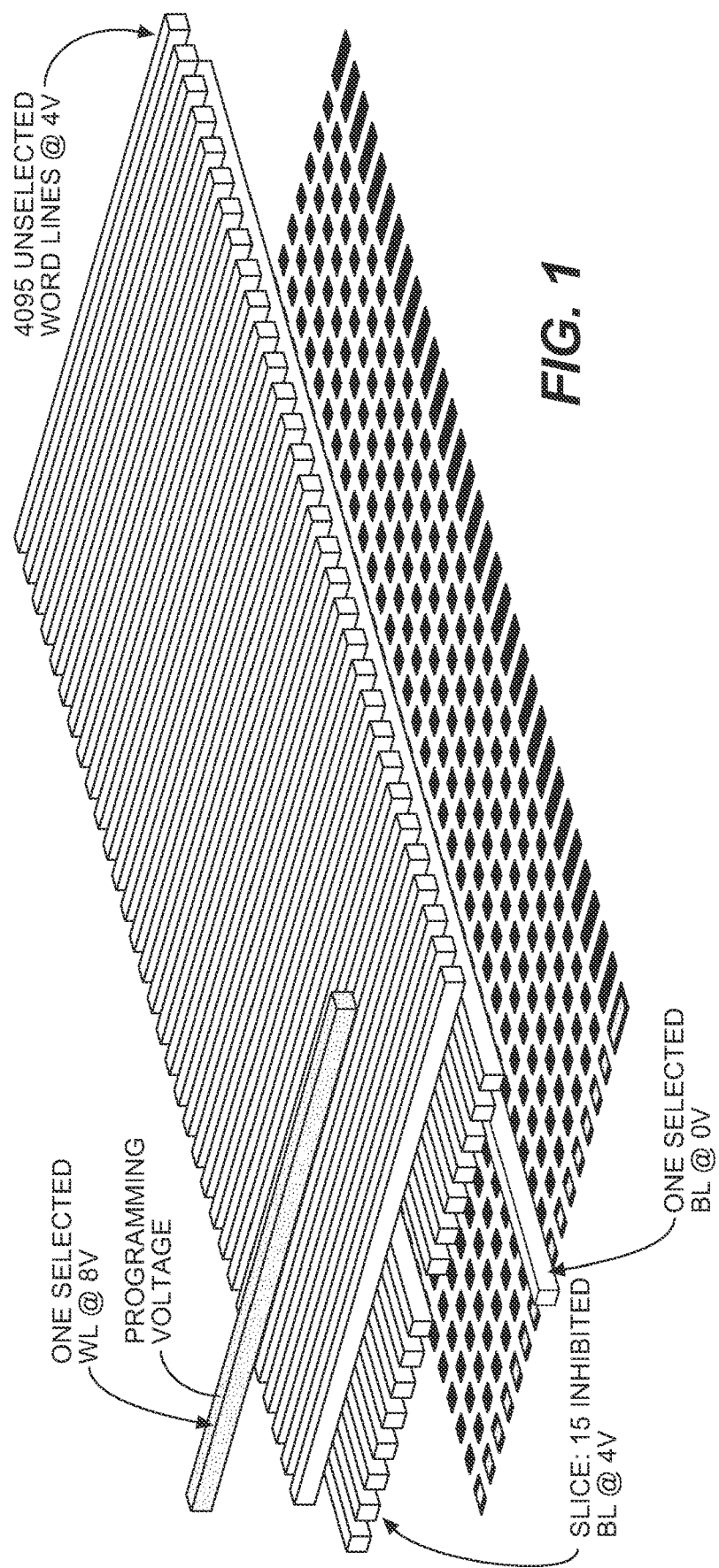
FIG. 1 illustrates an inhibit scheme that may be used in conjunction with a 3-dimensional array of NOR memory strings.

FIG. 1 illustrates an inhibit scheme that may be used in conjunction with a 3-dimensional array of NOR memory strings. In FIG. 1, a group of sixteen NOR memory strings provided in close proximity of each other in a 3-dimensional array are served by 4096 word lines, with each word line serving as gate electrodes to sixteen storage transistors ("one slice") within the group, one storage transistor from each NOR memory string in the group.

The '533 patent discloses that sense amplifiers for the storage transistors may be formed in or at the planar surface of the semiconductor substrate. Because of the high storage density desired, the storage transistors within a slice share a sense amplifier. As a result, only a single storage transistor within the slice may be selected at any given time for reading, while programming or erase may be performed in parallel. Of course, a slice may include any suitable number of storage transistors (e.g., 16, 32, 64, 128 etc.)

The 3-dimensional array may be organized, however, such that each of the 4096 word lines in the group of sixteen NOR memory strings may be connected to a like word line in each of numerous like groups of NOR memory strings. For example, one may connect 512 such groups of sixteen NOR memory strings, word line to word line, to create 512×4096 slices. In that arrangement, a 512-bit read operation may be carried out by concurrently reading one bit from each of the 512 slices associated with the same word line. A 3-dimensional array of NOR memory strings may thus be organized to carry out any read, programming or erase operation simultaneously on 512, 1024, 1536 or 2048 storage transistors (customarily referred to as a "page") in parallel in as many groups of NOR memory strings. In this detailed description, a memory structure that allows any read, programming or erase operation to be carried out simultaneously on all storage transistors in the page is referred to as a "n-page slice" (e.g., a 16-page slice), where n is the number of storage transistors in a slice.

As shown in FIG. 1, to program the selected storage transistor within a slice, the word line associated with the slice and the common bit line associated with the selected storage transistor ("selected common bit line") are brought to 8.0 volts and 0.0 volts, respectively. To erase the selected storage transistor within a slice (not shown in FIG. 1), the word line associated with the slice and the selected common bit line are brought to 0.0 volts and 8.0 volts, respectively. The common bit lines associated with the non-selected storage transistors in the slice ("non-selected common bit lines") are each set to 4.0 volts, which inhibits undesired programming of these non-selected storage transistors ("inhibited storage transistors") of the selected word line, even after repeated exposure. Concurrently, under this first inhibit scheme, the 4095 non-selected word lines in the 3-dimensional array of NOR memory strings are also set to 4.0 volts.

With the programming biasing configuration of FIG. 1, however, an inhibited storage transistor in the erased state may experience program disturb because the 4.0-volt voltage difference across the selected word line and the inhibited storage transistor's associated common bit line. At the same time, a non-selected storage transistor in the erased state sharing the selected common bit line experiences program disturb because of the 4.0-volt voltage difference across its non-selected word line and its selected common bit line. No storage transistor in the programmed state in the group of NOR memory strings, however, experiences any erase disturb.

Table 1a summarizes the disturb conditions during a program operation under the first inhibit scheme:

TABLE 1a

| | Selected Word Line (8.0 volts) | Non-selected Word Line (4.0 volts) |
|---|---|---|
| Selected Bit Line (0.0 volts) | — | 4.0 volts (program disturb) |
| Non-selected Bit Line (4.0 volts) | 4.0 volts (program disturb) | 0.0 volts |

With the erase biasing configuration of FIG. 1, an inhibited storage transistors that is in the programmed state may experience erase disturb because of the voltage difference across the selected word line and its non-selected common bit line. At the same time, a storage transistor in the programmed state sharing the selected common bit line experiences erase disturb because of the voltage difference across its non-selected word line and the selected common bit line. No storage transistor in the erased state in the group of NOR memory strings, however, experiences any program disturb.

Note that, while the sizeable voltage difference (i.e., 4.0 volts) across the selected word line and each non-selected common bit line reduces the program or erase disturb on the inhibited storage transistors, setting the 4095 non-selected word lines to the same voltage as a non-selected common bit line imposes a comparable program or erase disturb on non-selected storage transistors on the selected common bit line. Assuming that each word line is substantially equally likely to be selected, for any write operation, each storage transistor is more than 4000 times more likely to be associated with a non-selected word line than a selected word line. Therefore, the benefit of a reduced program disturb as an inhibited storage transistor is far outweighed by the much more frequent detriment of program or erase disturbs that arises from being associated with a non-selected word line.

Table 1b summarizes the disturb conditions during an erase operation under the first inhibit scheme:

TABLE 1b

| | Selected Word Line (0.0 volts) | Non-selected Word Line (4.0 volts) |
|---|---|---|
| Selected Bit Line (8.0 volts) | — | −4.0 volts (erase disturb) |
| Non-selected Bit Line (4.0 volts) | −4.0 volts (erase disturb) | 0.0 volts |

Figure 3A:
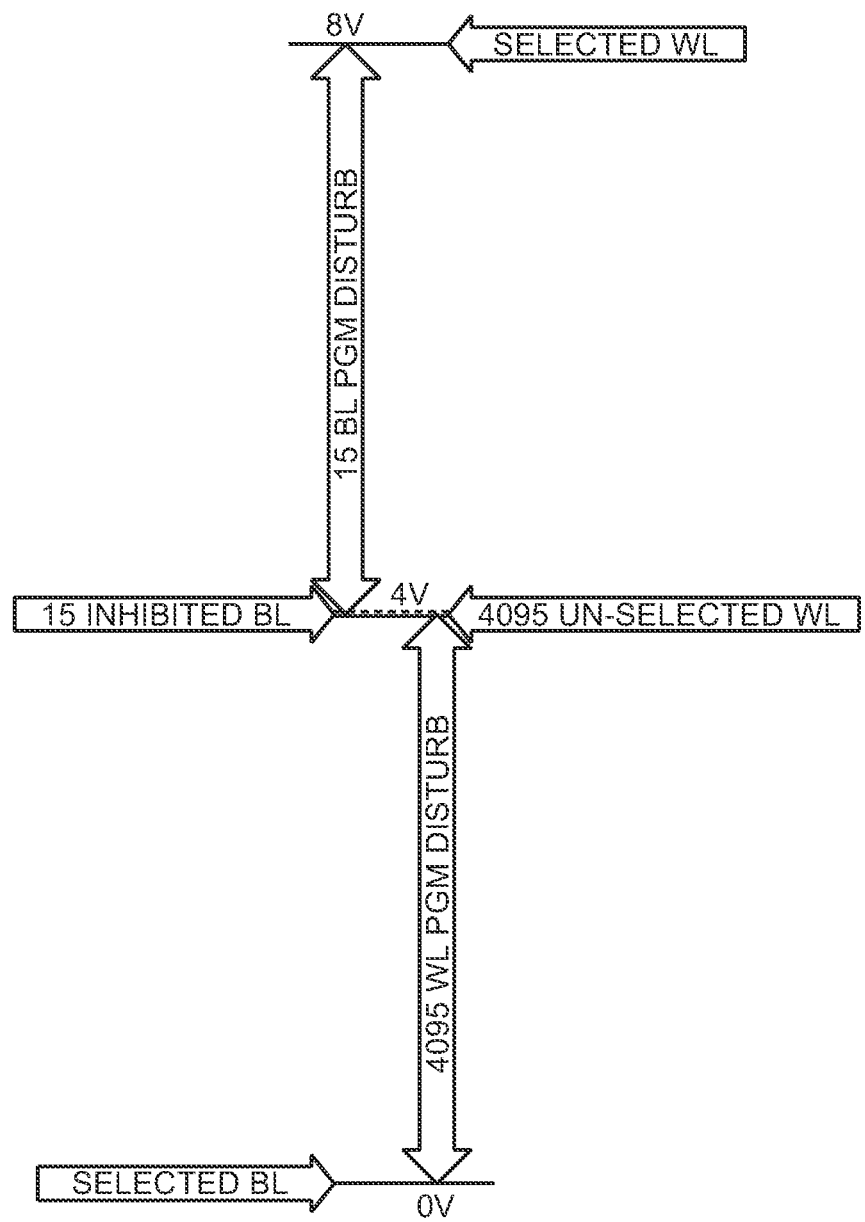
FIGS. 3(a) and 3(b) summarize the inhibit schemes of FIGS. 1 and 2, respectively, for a programming operation on a storage transistor in a slice.

FIG. 3(*a*) summarizes the first inhibit scheme illustrated in FIG. 1 for a programming operation on a storage transistor in a slice. A summary for the erase operation under this scheme is omitted.

Figure 2:
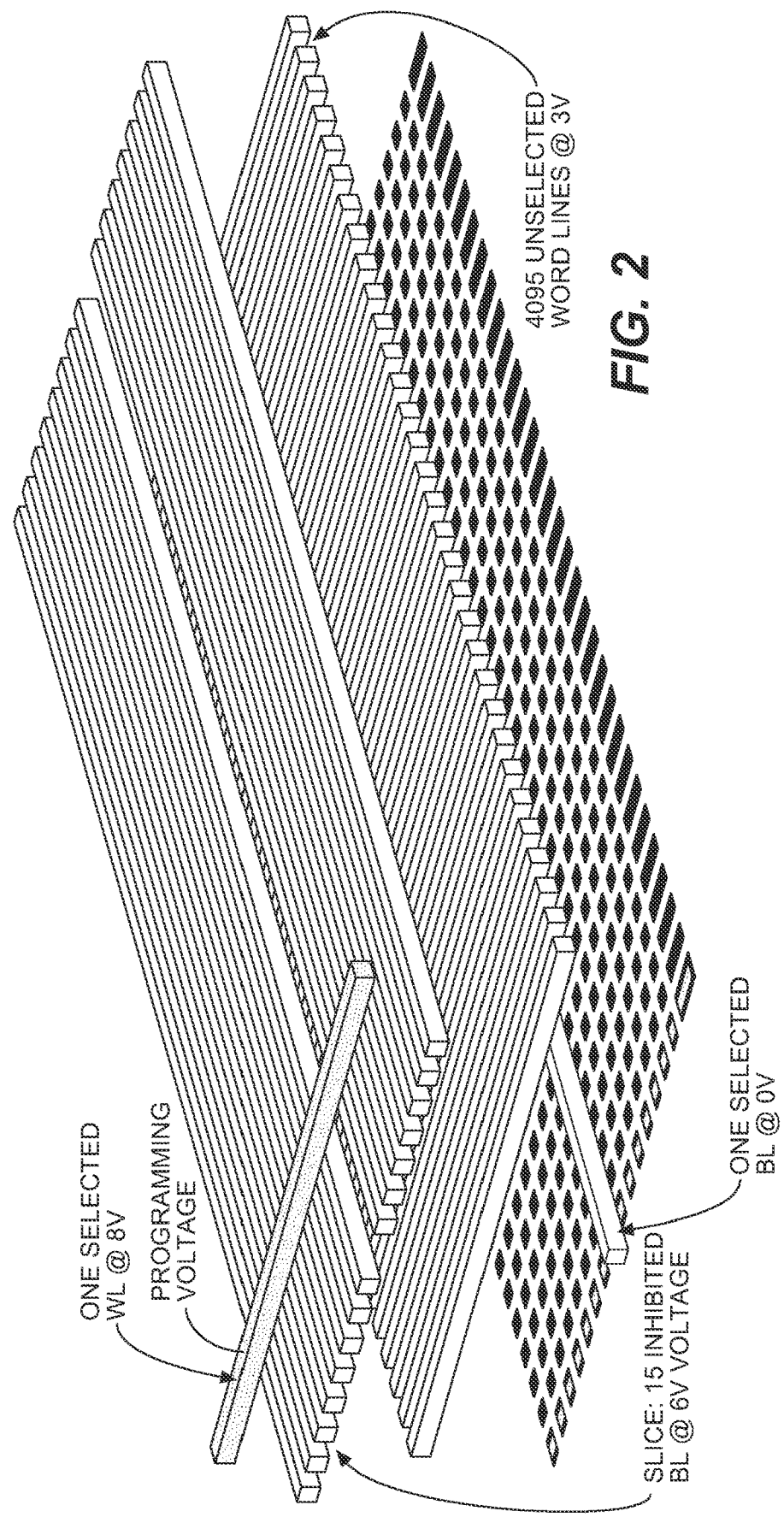
FIG. 2 illustrates an inhibit scheme that reduces the program disturbs from the non-selected word lines illustrated in FIG. 1.

FIG. 2 illustrates a second inhibit scheme that further reduces the program disturbs from the non-selected word lines illustrated in FIG. 1, according to a second inhibit scheme. As in FIG. 1, to program the selected storage transistor in a slice, the selected word line and the selected common bit line are brought to 8.0 volts and 0.0 volts, respectively. The non-selected common bit lines within the slice are each set, however, to a higher voltage of 6.0 volts, while the 4095 non-selected word lines are brought to a voltage approximately half-way between the voltage of the selected common bit line and the voltage of a non-selected common bit line (e.g., 3.0 volts).

With the programming biasing configuration in this second inhibit scheme, an inhibited storage transistor that is in the erased state may experience a lesser program disturb relative to the inhibit scheme of FIG. 1 because of the lesser voltage difference (i.e., 2.0 volts, rather than 4.0 volts) across the selected word line and its non-selected common bit line. A non-selected storage transistor in the erased state along the selected common bit line also experiences a lesser program disturb, as the voltage difference across its non-selected word line and the selected common bit line is also lessened (i.e., 3.0 volts, rather than 4.0 volts). However, a storage transistor in the programmed state associated with a non-selected word line and a non-selected common bit line would experiences an erase disturb under this second inhibit scheme, as a sizable voltage difference (−3.0 volts) exists across its non-selected word line and its non-selected common bit line.

Table 2a summarizes the disturb conditions during a program operation under the second inhibit scheme:

TABLE 2a

| | Selected Word Line (8.0 volts) | Non-selected Word Line (3.0 volts) |
|---|---|---|
| Selected Bit Line (0.0 volts) | — | 3.0 volts (program disturb) |
| Non-selected Bit Line (6.0 volts) | 2.0 volts (program disturb) | −3.0 volts (erase disturb) |

To erase a selected storage transistor in a slice (not shown in FIG. 2), the selected word line and the selected common bit line are brought to 0.0 volts and 8.0 volts, respectively. The non-selected common bit lines within the slice are set, however, to 2.0 volts, while the non-selected word lines are set to a voltage half-way between the voltage of a non-selected common bit line (e.g., 5.0 volts) and the voltage of the selected common bit line.

With the erase biasing configuration in this second inhibit scheme, an inhibited storage transistor that is in the programmed state may experience a lesser erase disturb relative to the inhibit scheme of FIG. 1 because of the lesser magnitude voltage difference (i.e., −2.0 volts, rather than −4.0 volts) across the selected word line and the non-selected common bit line. At the same time, a non-selected storage transistor in the programmed state on the selected common bit line also experiences a lesser erase disturb because of the lesser voltage difference (−3.0 volts) across the non-selected word line and the non-selected common bit line. A storage transistor in the erased state along a non-selected common bit line, however, may experience program disturb because of the 3.0-volt voltage difference across the non-selected word line and the non-selected common bit line.

Table 2b summarizes the disturb conditions during an erase operation under the second inhibit scheme:

TABLE 2b

|  | Selected Word Line (0.0 volts) | Non-selected Word Line (5.0 volts) |
|---|---|---|
| Selected Bit Line (8.0 volts) | — | −3.0 volts (erase disturb) |
| Non-selected Bit Line (2.0 volts) | −2.0 volts (erase disturb) | 3.0 volts (program disturb) |

Figure 3B:
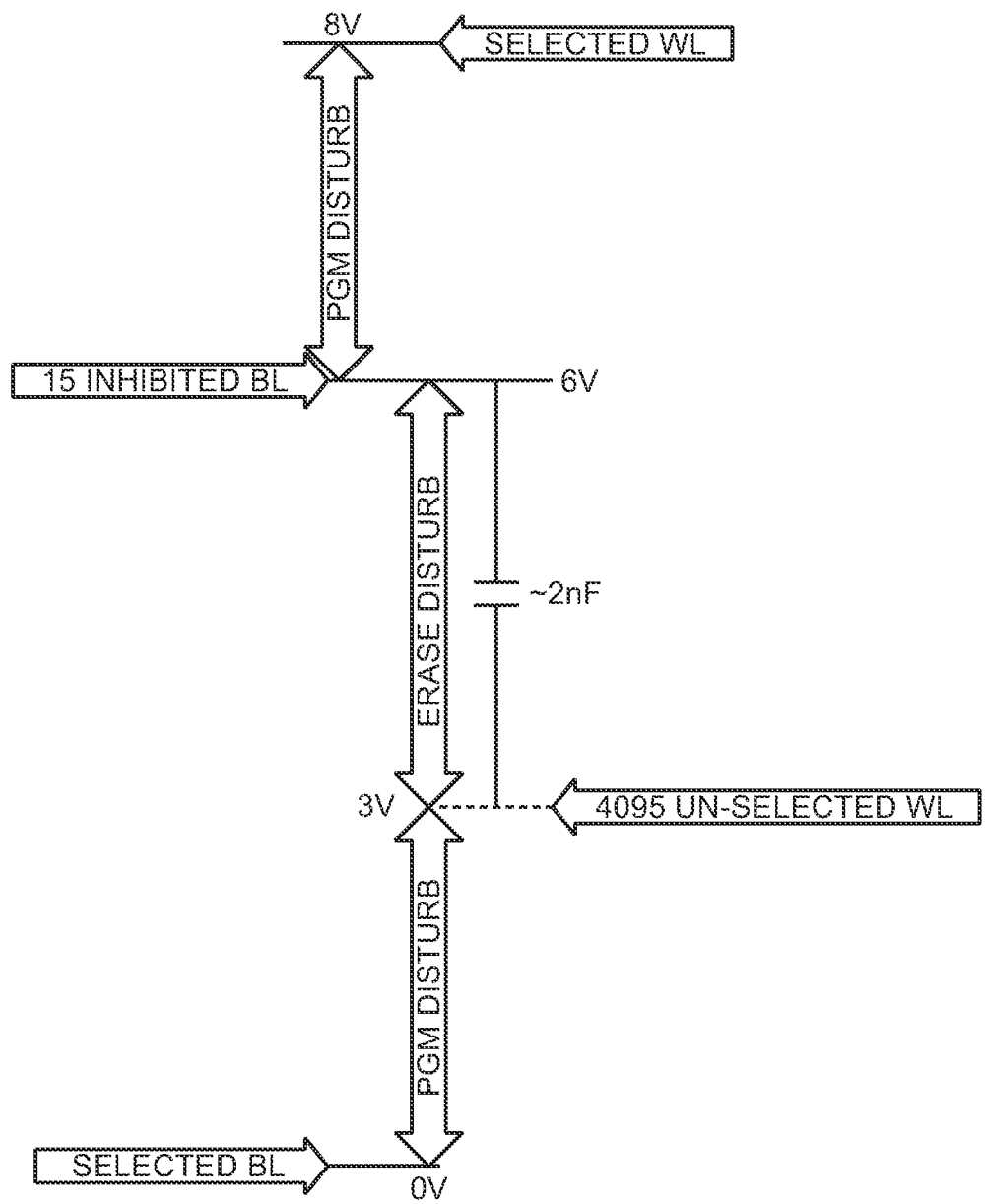

FIG. 3(b) summarizes the second inhibit scheme illustrated in FIG. 2 for a programming operation on a storage transistor in a slice. A summary for the erase operation under this scheme is omitted.

Thus, under this second inhibit scheme, the voltages applied to non-selected common bit lines in a slice (i.e., 6.0 volts for programming and 2.0 volts for erase) to inhibit undesired programming or erase of the associated storage transistors, desirably reduce program and erase disturbs in non-selected storage transistors on a selected word line or a selected common bit line, at the cost of introducing erase disturb and program disturb in other non-selected storage transistors during these operations.

Also, in the example of FIG. 1, there is no voltage difference across any one of the 4095 non-selected word lines and any one of the 15 non-selected common bit lines, both plates of such a capacitor being at 4.0 volts. Accordingly, there is no power expended to charge and discharge each such capacitor. In contrast, in the example of FIG. 2, as there is a 3.0-volt or −3.0-volt voltage difference across a parasitic capacitor formed out of one of the 4095 non-selected word lines and one of the 15 non-selected common bit lines, power is expended to charge and discharge each such capacitor during each programming or erase operation.

Figure 4A:
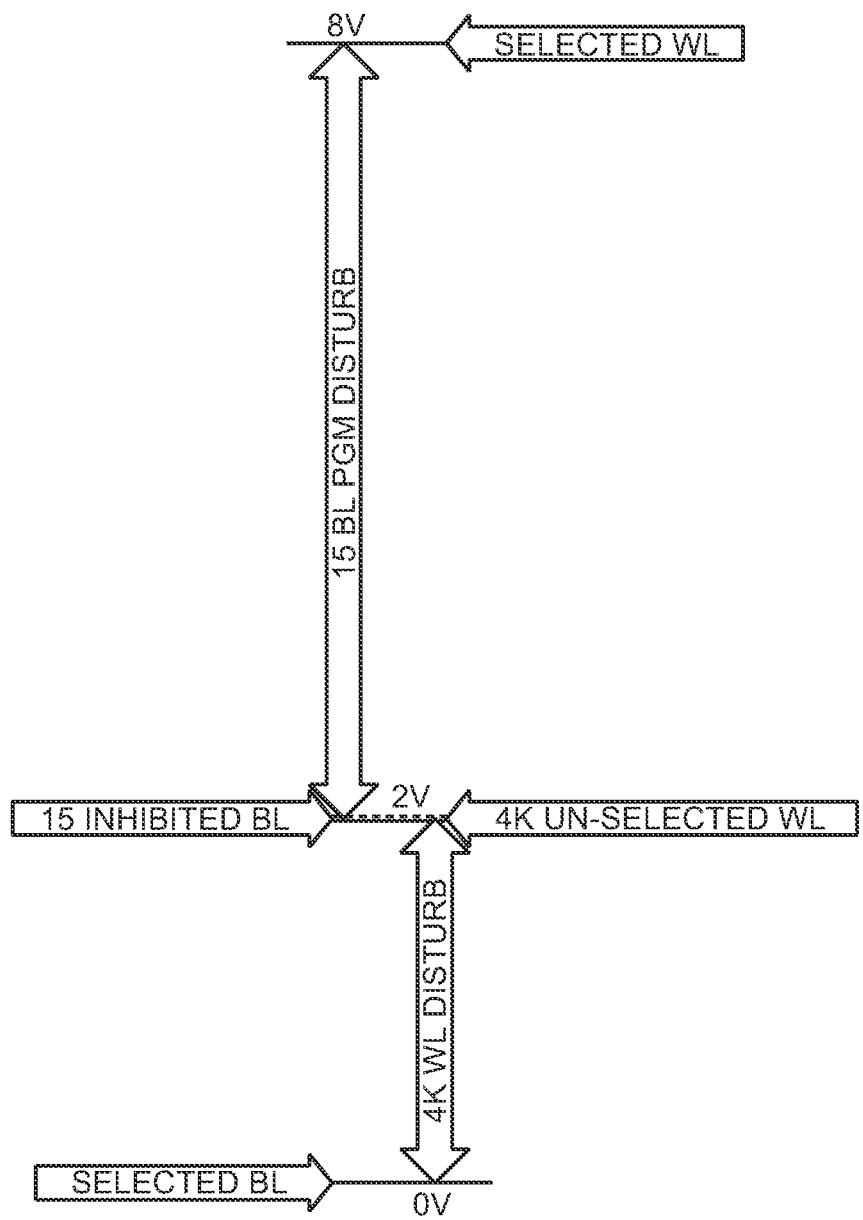
FIG. 4(a) summarizes a programming bias configuration for a third inhibit scheme; this third inhibit scheme is analogous to the inhibit scheme of FIG. 1, having a voltage of 2 volts for both the non-selected common bit lines in the slice and the 4095 non-selected word lines.

According to one embodiment of the present invention, by setting the non-selected common bit lines each to a voltage that is closer to the voltage on the selected common bit line, the program or erase disturb on the inhibited storage transistors is worsened, but the program or erase disturb is significantly reduced for a storage transistor along the selected bit line, due to the voltage of the non-selected word line. FIG. 4(a) summarizes a programming bias configuration for this third inhibit scheme. Like the first inhibit scheme of FIG. 1, this third inhibit scheme has the same voltage for both the non-selected common bit lines in the slice and the 4095 non-selected word lines. In this case, that same voltage is 2.0 volts.

Table 3a summarizes the disturb conditions during a program operation under the third inhibit scheme:

TABLE 3a

|  | Selected Word Line (8.0 volts) | Non-selected Word Line (2.0 volts) |
|---|---|---|
| Selected Bit Line (0.0 volts) | — | 2.0 volts (program disturb) |
| Non-selected Bit Line (2.0 volts) | 6.0 volts (program disturb) | 0.0 volts |

For the erase bias configuration in this third inhibit scheme, a voltage of 6.0 volts is imposed for both the non-selected common bit lines in the slice and the non-selected word lines.

Table 3b summarizes the disturb conditions during an erase operation under the third inhibit scheme:

TABLE 1b

|  | Selected Word Line (0.0 volts) | Non-selected Word Line (6.0 volts) |
|---|---|---|
| Selected Bit Line (8.0 volts) | — | −2.0 volts (erase disturb) |
| Non-selected Bit Line (6.0 volts) | −6.0 volts (erase disturb) | 0.0 volts |

As discussed above, if each word line is substantially equally likely to be selected, for any write operation, a storage transistor is more than 4000 times more likely to be associated with a non-selected word line than a selected word line. Therefore, the detriment of the worsened program or erase disturb in an inhibited storage transistor is far outweighed by the much more frequent benefit of lessened program or erase disturbs from being associated with a non-selected word line. Thus, the overall program or erase disturbs experienced by a storage transistor under this third inhibit scheme is significantly diminished relative to the inhibit schemes of FIGS. 1 and 2 described above, especially when implemented in conjunction with the "partial refresh" scheme described below.

Figure 4B:
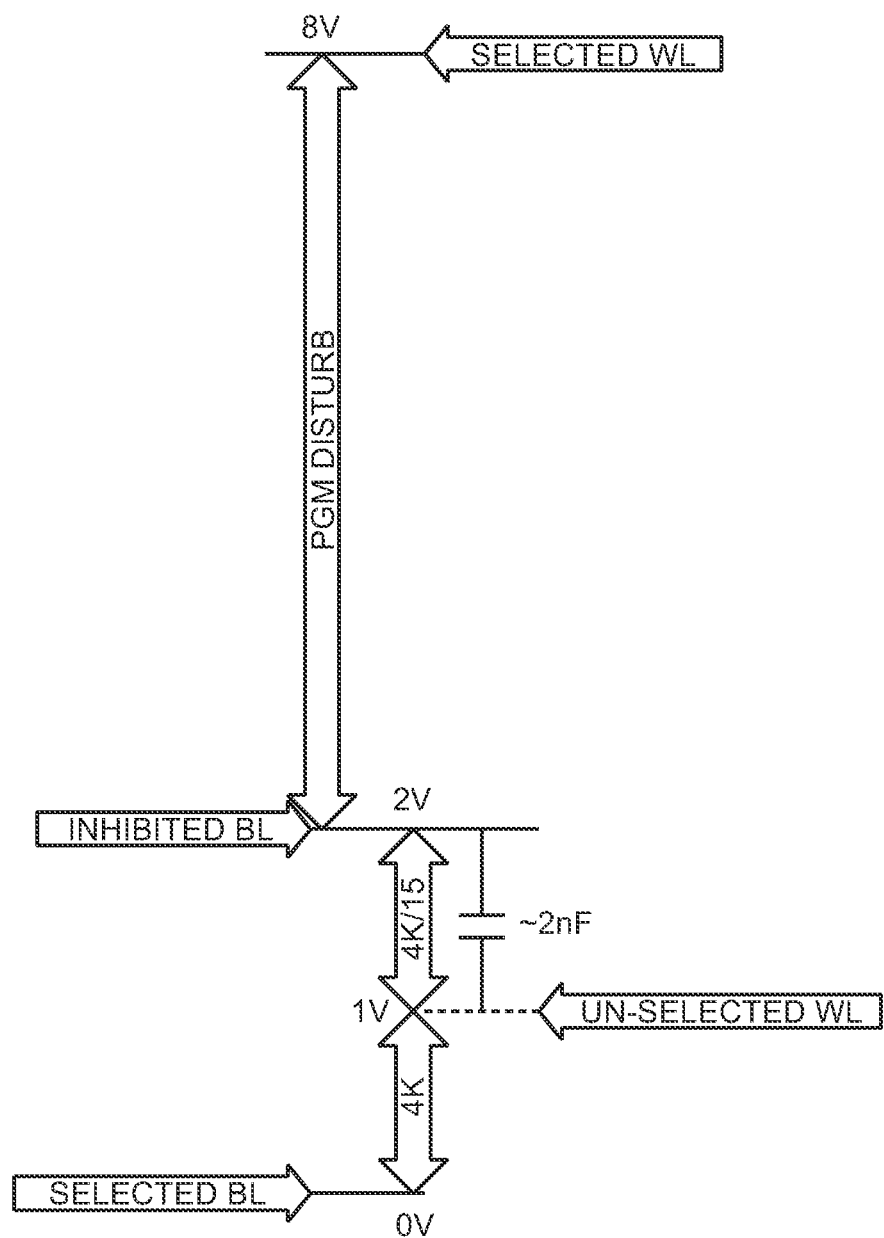
FIG. 4(b) summarizes a programming bias configuration for a fourth inhibit scheme; this fourth inhibit scheme is analogous to the inhibit scheme of FIG. 2, having (i) for each of the non-selected common bit lines in the slice, a voltage of 2 volts, and (ii) for the 4095 non-selected word lines, a voltage that is substantially half-way between the voltages of a non-selected common bit line and the selected common bit line (i.e., 1 volts).

FIG. 4(b) summarizes a programming bias configuration for a fourth inhibit scheme. Under this fourth inhibit scheme, during programming, (i) each of the non-selected common bit lines in the slice is set to 2.0 volts, and (i) the 4095 non-selected word lines are each set to a voltage that is substantially half-way between the voltage of a non-selected common bit line and the voltage of the selected common bit line (i.e., 1 volts).

Table 4a summarizes the disturb conditions during a programming operation under the fourth inhibit scheme:

TABLE 4a

|  | Selected Word Line (8.0 volts) | Non-selected Word Line (1.0 volts) |
|---|---|---|
| Selected Bit Line (0.0 volts) | — | 1.0 volts (program disturb) |
| Non-selected Bit Line (2.0 volts) | 6.0 volts (program disturb) | −1.0 volts (erase disturb) |

For the erase bias configuration under the fourth inhibit scheme, during an erase operation, (i) 6.0 volts is imposed on the non-selected common bit lines, and (ii) 7.0 volts is imposed on the non-selected word lines, which is half-way between the voltage of a non-selected common bit line and the voltage of a selected common bit line.

Table 4b summarizes the disturb conditions during an erase operation under the fourth inhibit scheme:

TABLE 2b

|  | Selected Word Line (0.0 volts) | Non-selected Word Line (7.0 volts) |
|---|---|---|
| Selected Bit Line (8.0 volts) | — | −1.0 volts (erase disturb) |
| Non-selected Bit Line (6.0 volts) | −6.0 volts (erase disturb) | 1.0 volts (program disturb) |

However, in this fourth inhibit scheme, relative to the third inhibit scheme of FIG. 4(a), this fourth inhibit scheme expends additional power to charge and discharge any parasitic capacitor between a non-selected word line and a non-selected common bit line.

Based on a study performed by the inventor, an inhibited storage transistor can endure at least a certain number of the inhibit pulses ("threshold inhibit number") before the cumulative program or erase disturbs cause the storage transistor's threshold voltage to deviate from its programmed or erased threshold voltage into an undesirable zone between the range of allowable programmed state threshold voltages and the range of allowable erased state threshold voltages. Specifically, in embodiments where the non-selected common bit lines and the non-selected word lines receive the same voltage ("single-voltage case"; e.g., the examples of FIGS. 1 and 4(a)), the threshold inhibit number refers to the difference between the number of programming operations and the number of erase operations. In embodiments where the non-selected word lines and the non-selected common bit lines receive different voltages ("split-voltage case"; e.g., the examples of FIGS. 2 and 4(b)), the threshold inhibit number refers to the total number of programming and erase operations.

For a slice with sixteen storage transistors, the threshold inhibit number must exceed 15 to allow a full-slice programming or erase operation (i.e., every storage transistor in the slice is programmed or erased); otherwise, the program or erase disturbs may bring the threshold voltage of one or more of the storage transistors within the slice into the undesirable zone before the full-slice programming or erase operation completes. (In one embodiment, the 16 storage transistors in the slice share a single sense amplifier.) To avoid data loss, a "partial refresh" operation—i.e., a data refresh operation that involves less than all the storage transistors within the slice—may be carried out in conjunction with each programming or erase operation.

Figure 5:
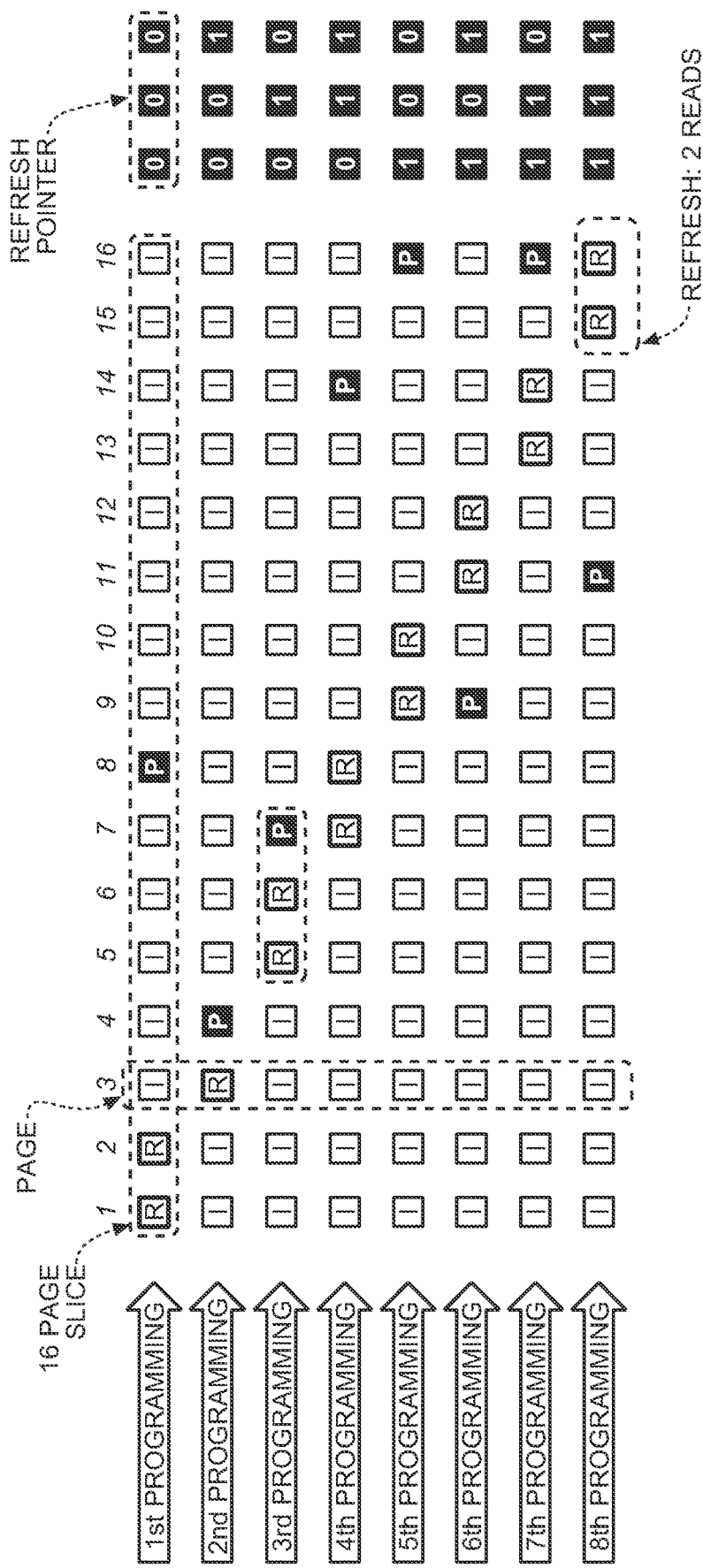
FIG. 5 illustrates the operations of a partial refresh scheme for a 16-page slice, under a threshold inhibit number of 8, in accordance with one embodiment of the present invention.

FIG. 5 illustrates the operations of a partial refresh scheme for a slice of 16 storage transistors, under a threshold inhibit number of 8, in accordance with one embodiment of the present invention. Each storage transistor in a slice also represents one bit in a separate multi-bit page of data that is read or written in parallel. A typical page may be, for example, 512 bits. Thus, in FIG. 5, each programming or erase operation may also be seen as an operation on an entire page of data. The term "slice" may therefore also be used in this detailed description to refer, collectively. to 16 pages of data that are separately programmed or erased.

As the threshold inhibit number is 8, each page within the slice (the "page-slice," in this instance), must be refreshed at least once prior to eight write operations being carried out on pages in the slice. Thus, in conjunction with each write operation on a page in the slice, a partial refresh operation involving reading and writing back two designated pages in the slice is carried out. (One of the designated may, coincidentally, be the target of the write operation; in which case, the write operation is carried out and the data read in conjunction with the partial refresh is discarded.) Under the partial refresh scheme, no storage transistor associated with a page within the slice will experience more than the threshold inhibit number of inhibition pulses (i.e., 8, in this case) before its next partial refresh. In other embodiments, the threshold inhibit number may be higher (e.g., 15) and, accordingly, each partial refresh operation need only involve one designated page in the slice.

For a threshold inhibit number of eight, the 16 pages in the slice may be divided into 8 non-overlapping refresh groups, each designating a different set of two pages in the slice. Under a schedule that selects a different refresh group in conjunction with 8 consecutive write operations, a partial refresh operation may be performed on all 16 pages in the slice. The value of a 3-bit pointer ("refresh state") encodes which of the 8 refresh groups is to be selected for partial refresh in conjunction of the next write operation. In FIG. 5, the first refresh state ("000") designates pages <1> and <2> for partial refresh. In this example, during refresh state "000", pages <1> and <2> undergo partial refresh in conjunction with a programming or erase operation on page <8>. After designated pages <1> an <2> undergo partial refresh in conjunction with a write operation, the value of the 3-bit pointer is set to the next refresh state (i.e., "001"), which designates pages <3> and <4> for partial refresh. FIG. 5 shows the schedule or sequence that rotates through the 16 pages in order. When the eighth refresh state (i.e., refresh state "111") is entered, 14 of the 16 pages in the slice have been designated and have undergone partial refresh once in conjunction with seven programming or erase operations on the 16-page slice. After refresh state "111," the schedule returns to refresh state "000,"

FIG. 5 includes the example of a write operation targeting page <4> during refresh state "001", which is also a page designated for partial refresh in that refresh state. In that event, the data associated with the write operation is written into the designated page (i.e., page <4> in the example of FIG. 5) and the data read from the designated page is not used.

Note that, in a write operation on a page, the data to be written requires some of the storage transistors in the page to be put into the programmed state, while the other storage transistors in the page are required to be put into the erased state. Accordingly, each write operation includes a "programming phase" and an "erase phase" that set those storage transistors to be put into the programmed state and those storage transistors to be put into the erased state, respectively. In the concurrent partial refresh operation, the data read from a designated page requires some of the storage transistors in the designated page to be put into the programmed state. Those storage transistors would be set to the programmed state during the program phase of the write operation. Likewise, the other storage transistors in the designated page of the partial refresh operation are put into the erased state during the erase phase of the write operation.

Figure 6A:
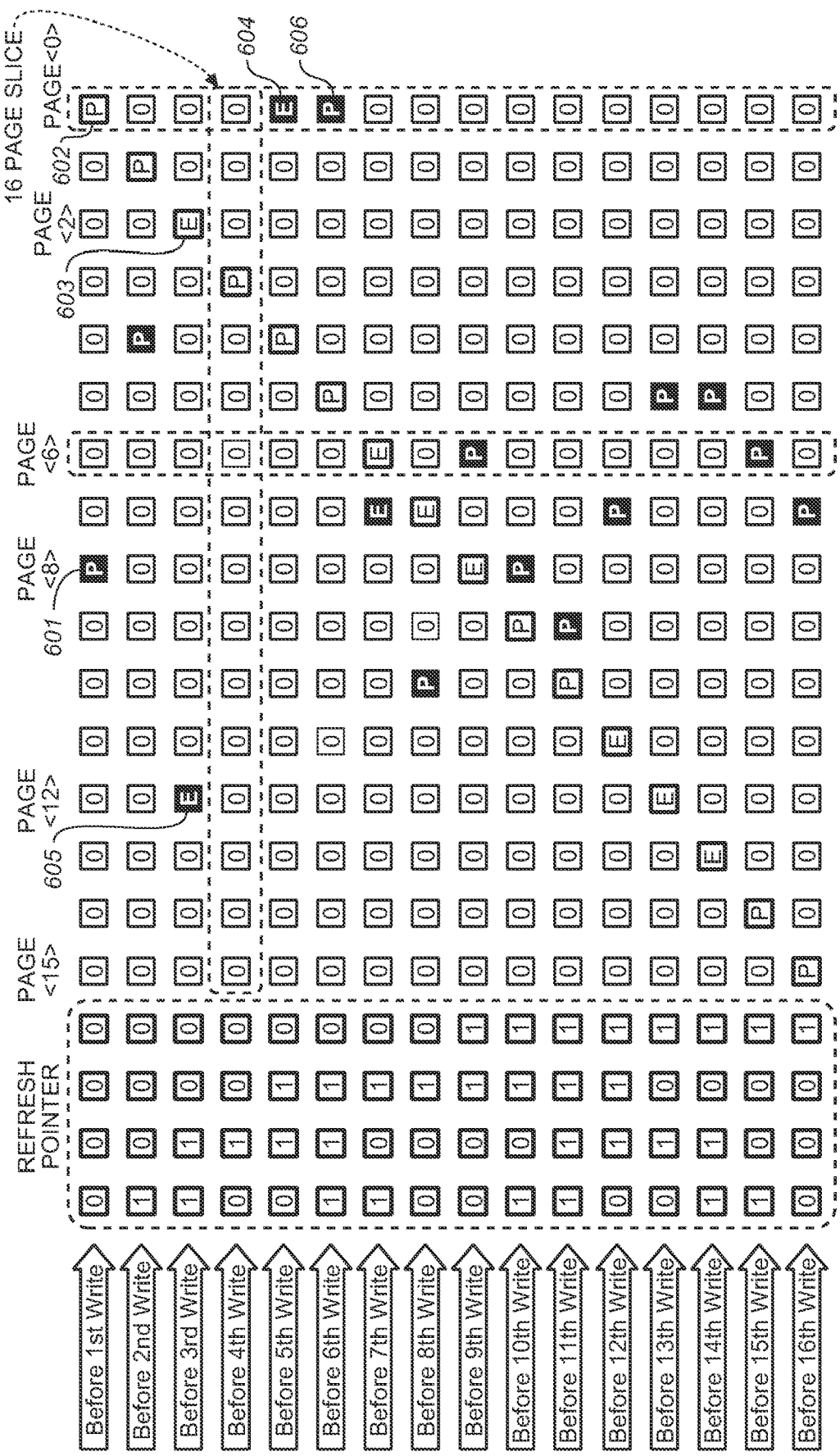
FIG. 6(a) illustrates a partial refresh scheme for a 16-page slice, carried out in write operations in conjunction with the third inhibit scheme described above.

FIG. 6(a) illustrates a partial refresh scheme for a 16-page slice, with a threshold inhibit number of 16 and under the third inhibit scheme of FIG. 4(a), in accordance with one embodiment of the present invention. Accordingly, In FIG. 6(a), one page is designated for partial refresh in conjunction with each write operation, so that no page experiences 16 or more write operations before being refreshed. In this example, pages <0> to <15> are respectively designated for partial refresh during the 16 write operations. A 4-bit pointer encodes the refresh states and keeps track of the next page designated for partial refresh in conjunction with the next write operation. The refresh pointer is incremented after each write operation. In FIG. 6(a), the 4-bit pointer is implemented by a 4-bit Grey codes. Using Grey codes ensures that only one bit needs to be rewritten between successive pointer values.

FIG. 6(a) uses a specific bit ("exemplary bit") in each page of the 16-page slice to illustrate the operations on the exemplary bit in the erase and the program phases of a write operation. For example, for a page to be written, which is represented in FIG. 6(a) by a filled box, a "P" indicates that the exemplary bit is to be set in the programmed state. Alternatively, a "E" indicates that the exemplary bit is to be written into the erased state. Likewise, fir a page to be refreshed, which is represented in FIG. 6(a) by a box with a bold outline, a "P" in the box indicates that the exemplary bit is read to be in the programmed state and thus to be reinforced in that state. Alternatively, a "E" indicates that the exemplary bit is read to be in the erased state and thus is to be reinforced in that state. All the other pages are represented by a box with a "0"; those pages are to be inhibited. In the Initially, a 4-bit refresh pointer has value "0000", which encodes the refresh state in which page <0> is designated for partial refresh. FIG. 6(a) shows that, in this example, the exemplary bit (indicated by reference numeral 602) is to be reinforced in its programmed state. In this example, the write operation in this refresh state is to be carried out on page <8> (indicated by reference numeral 601) and its exemplary bit is also to be set into a programmed state.

Similarly, as shown in FIG. 6(a), at the third write operation, the 4-bit refresh pointer has value "1100", which encodes the refresh state in which page <2> is designated for partial refresh. The exemplary bit of page <2> (indicated by reference numeral 603) is to be reinforced in its erased state. Concurrently, in this example, the third write operation is to be carried out on page <12> (indicated by reference numeral 605) and its exemplary bit is to be set to an erased state.

As shown in FIG. 6(a), in the fifth and sixth write operations, the 4-bit pointer has values "0110" and "1110", thus encoding the refresh states in which pages <4> and <5> are designated for partial refresh. In FIG. 6(a), during the fifth and sixth write operations, both targeting page <0>, the exemplary bits are to be written to the erased state (indicated by reference numeral 604) and to the programmed state (indicated by reference numeral 606), respectively. During the fifth write operation, as the exemplary bit for page <4> is read to be in the programmed state, the common bit line for page <4> is set to the voltage for erase inhibit during the erase phase that sets the exemplary bit of page <0> to the erased state. During the sixth write operation, as the exemplary bit for page <5> is read to be in the programmed state, the common bit line for page <5> is set to the voltage for programming during the programming phase, so that the programming operation on pages <0> and <5> may be carried out concurrently.

Figure 6B:
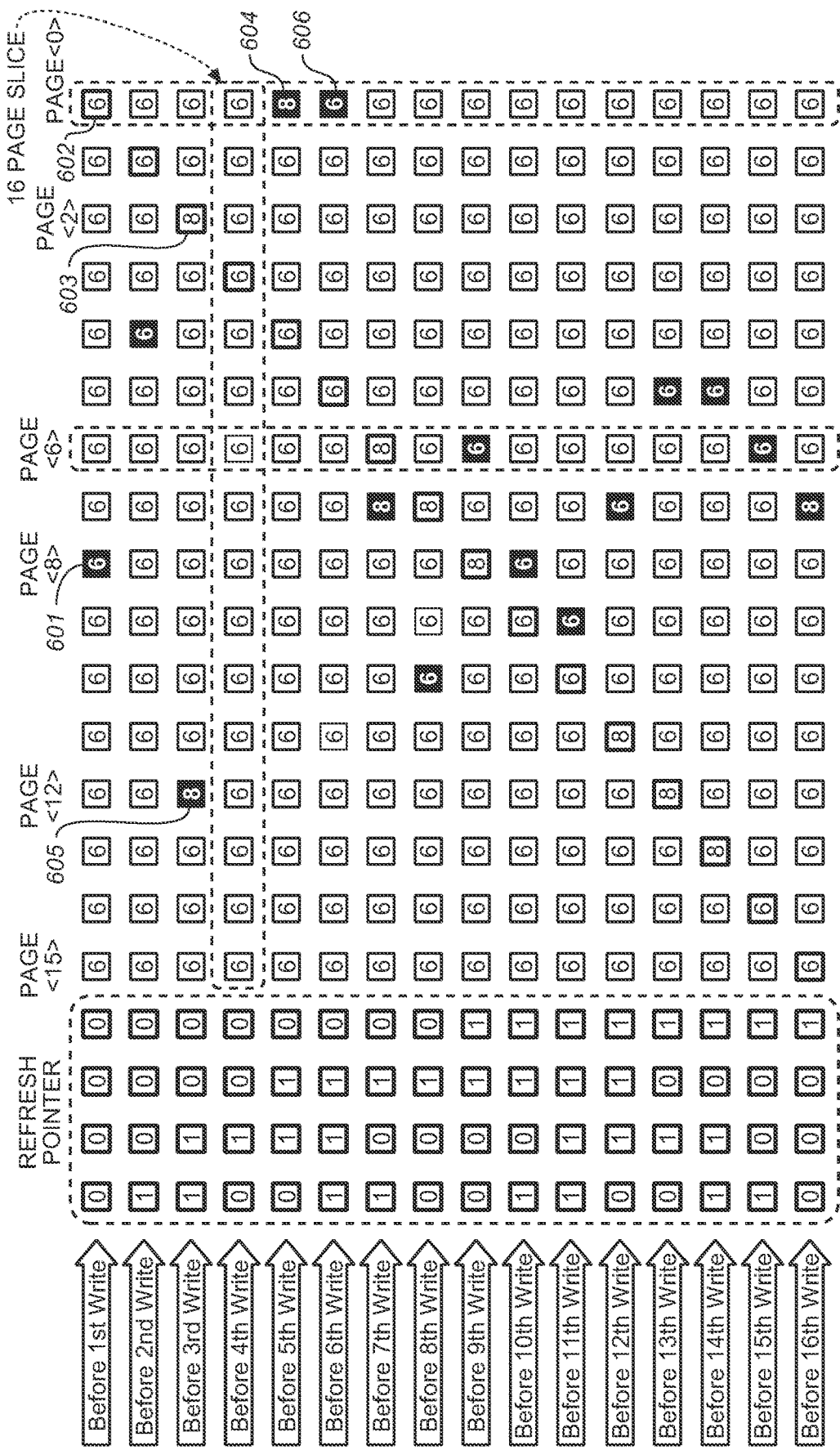
FIG. 6(b) illustrates the operations during the erase phase of each write operation of FIG. 6(a).

FIG. 6(b) illustrates the operations during the erase phase of each write operation of FIG. 6(a). During the erase phase, the selected word line is set to 0 volts. As shown in FIG. 6(b), during the first write operation (i.e., when the refresh pointer has value "0000"), as the exemplary bits of pages <8> (reference numeral 601) and page <0> (reference numeral 602) are to be set and reinforced, respectively, to the programmed state, both the selected common bit lines of pages <8> and <0> are brought to 6.0 volts to inhibit undesired erasing of the exemplary bits of these pages. The non-selected common bit lines of the other pages are also brought to 6 volts to inhibit any undesired erase.

Similarly, during the erase phase of the third write operation (i.e., when the refresh pointer has value "1100"), the exemplary bits of pages <12> (reference numeral 605) and <2> (reference numeral 603) are brought to 8.0 volts, to effectuate the erase operation. The non-selected common bit lines of the other pages are also brought to 6.0 volts to inhibit any undesired erase.

Likewise, during the erase phase of the fifth write operation (i.e., when the refresh pointer has value "0110"), the exemplary bit of page <0> (reference numeral 605) is brought to 8.0 volts to effectuate the erase operation. During the erase phase of the sixth write operation (i.e., when the refresh pointer has value "1110"), the exemplary bit of page <0> (reference numeral 606) is brought to 6.0 volts to inhibit an undesired erase. The common bit lines for the exemplary bits of pages <4> and <5> during the erase phases of the fifth and sixth write operations are brought to the 6.0 volts to inhibit any undesired erase.

Figure 6C:
FIG. 6(c) illustrates the operations during the program phase of each write operation of FIG. 6(a)

FIG. 6(c) illustrates the operations during the program phase of each write operation of FIG. 6(a). During the program phase, the selected word line is set to 8.0 volts. As shown in FIG. 6(c), when the refresh pointer has value "0000", as both the exemplary bits of page <8> (reference numeral 601) and page <0> (reference numeral 602), the selected common bit lines of both pages <8> and <1> are brought to 0.0 volts to effectuate programming of the exemplary bits of these pages. The non-selected common bit lines of the other pages are brought to 2.0 volts to inhibit any undesired programming.

Similarly, during the programming phase of the third write operation (i.e., when the refresh pointer has value "1100"), the exemplary bits of pages <12> (reference numeral 605) and <2> (reference numeral 603) are brought to 2.0 volts to inhibit any undesired programming operation on these exemplary bits. The non-selected common bit lines of the other pages are also brought to 2.0 volts to inhibit any undesired programming.

Likewise, during the program phase of the fifth write operation (i.e., when the refresh pointer has value "0110"), the exemplary bit of page <0> (reference numeral 605) is brought to 2.0 volts to inhibit any undesired programming During the program phase of the sixth write operation (i.e., when the refresh pointer has value "1110"), the exemplary bit of page <0> (reference numeral 606) is brought to 0.0 volts to effectuate the programming of the exemplary bit. The common bit lines for the exemplary bits during the program phases of the fifth and sixth write operations are brought to the 2.0 volts to inhibit any undesired programming.

Note that the refresh pointer representing each refresh state is common to all pages in the page slice and thus is required meta-data to be written in conjunction with each write operation within the page slice. In one embodiment, the refresh pointer is stored in every page of the page slice, the redundancy ensuring integrity. Accordingly, two read operations are carried out prior to each write operation: (a) one read operation on any page to retrieve the refresh pointer to determine which page is designated for partial refresh, and (b) a second read operation from the page or pages designated for partial refresh. In one embodiment, the second read may also retrieve the pointer value from the page or pages designated to be refreshed. If the pointer values retrieved do not all agree, one of the store page values may be corrupt. If necessary, a third read operation may be performed to retrieve a tie-breaking pointer value, although such a read should be a very rare occurrence. Note that, in some embodiments, error correction is carried out by the controller during a read operation independent of the memory circuit. In those embodiments, the partial refresh scheme may reinforce errors in the memory circuit. Alternatively, in another embodiment, to avoid reading multiple memory pages from the refresh group multiple copies (e.g., preferably 3 or any suitable odd number) may be stored in a designated page. In that embodiment, the consensus of a majority of the copies (3:0 or 2:1) controls.

The above detailed description is intended to illustrate specific embodiments of the present invention and is not intended to be limiting. Numerous modifications and variations within the scope of the present invention are possible. For example, although the detailed description above uses, as an example, NOR memory strings that store data as electric charge, the present invention is equally applicable to NOR memory strings that store data in the form of ferroelectric polarization (e.g., NOR memory strings of ferroelectric field-effect transistors (FeFETs)). The present invention is set forth in the accompanying claims.

I claim:

1. A method ensuring data integrity in a plurality of memory pages, the memory pages being implemented in a 3-dimensional array of storage transistors, the method comprising:
    dividing the memory pages into a predetermined number of refresh groups;
    storing a value that represents a number of program or erase disturbs the memory pages have experienced, the value being stored in each of the memory pages;
    and for each write operation to be performed on a selected one of the memory pages:
    selecting one of the refresh groups;
    reading data stored in storage transistors associated with the memory pages of the selected refresh group; and
    concurrently (i) performing the write operation on the selected memory page, and (ii) writing the data read back into the storage transistors associated with the memory pages of the selected refresh group.

2. The method of claim 1, wherein three or more copies of the value are stored in a designated one of the memory pages.

3. The method of claim 1, further comprising (i) reading the value from both the selected page and one of the memory pages in the refresh group, and (ii) determining if the values read from the selected page and the memory page in the refresh group agree.

4. The method of claim 1, wherein the refresh groups are selected one-by-one in a round-robin fashion.

5. The method of claim 1, wherein the write operation comprises an erase phase and a program phase.

6. The method of claim 5 wherein, during the erase phase, the write operation carries out an erase operation on each storage transistor of the selected page that is designated to be set to the erased state.

7. The method of claim 5 wherein, during the program phase, the write operation carries an programming operation on each storage transistor in the selected page that is designated to be set to the programmed state.

8. The method of claim 1, wherein (i) the value encodes one of a plurality of states representing an operating condition of the memory pages, (ii) each refresh group is selected for refresh in at least one of the states, and (iii) the value resets to an initial value after all the memory pages have been refreshed.

9. The method of claim 8, wherein the operating condition relates to an inhibit scheme for non-selected storage transistors in the memory pages.

10. The method of claim 9, wherein the value is represented in the memory pages as Grey codes.

11. The method of claim 1, wherein the 3-dimensional array of storage transistors is organized as a 3-dimensional array of NOR memory strings, wherein each storage transistor is associated with one of a plurality of word lines and a common bit line that it shares with other storage transistors on its NOR memory string.

12. The method of claim 11, wherein the predetermined number of refresh groups is determined from a figure of merit that represents a number of times voltages are applied to common bit lines associated with the storage transistors in non-selected memory pages during a write operation to inhibit the storage transistors from being written into.

13. The method of claim 11, wherein the memory pages are organized as slices, each slice including a storage transistor from each memory page, the storage transistors of each slice being associated with the same word line and sharing a sense amplifier.

14. The method of claim 11, wherein the concurrently (i) performing the write operation and (ii) writing back the data read comprises:
    selecting one of word lines and one of the common bit lines;
    biasing the selected word line and the selected common bit line to a predetermined voltage difference for a programming or erase operation;
    biasing each of the non-selected common bit lines to a first voltage, such that, across the selected common bit line and each of the non-selected common bit line is imposed a first voltage difference that is a first fraction—less than 1.0 in magnitude—of the predetermined voltage difference; and
    biasing each of the non-selected word lines to a second voltage, such that, across the selected common bit line and each of the non-selected common bit line, is imposed a second voltage difference that is a second fraction—less than 1.0 in magnitude—of the predetermined voltage difference.

15. The method of claim 14, wherein the first voltage and the second inhibit voltage are approximately equal.

16. The method of claim 14, wherein the first and second voltages have different values.

17. The method of claim 14, wherein the first fraction is twice the second fraction.

18. The method of claim 14, wherein the first fraction has a magnitude greater than 0.5.

19. The method of claim 14, wherein the predetermined voltage difference is either 8.0 volts or −8.0 volts.

20. The method of claim 19, wherein the second voltage difference has a magnitude between about 2.0 volts and about 6.0 volts.

21. The method of claim 19, wherein the second voltage difference has a magnitude between about 1.0 volt and about 3.0 volts.

22. The method of claim 20, wherein the first voltage difference has a magnitude between about 2.0 volts and about 6.0 volts.

* * * * *